(12) United States Patent
Awata et al.

(10) Patent No.: US 7,382,042 B2
(45) Date of Patent: Jun. 3, 2008

(54) COF FLEXIBLE PRINTED WIRING BOARD AND METHOD OF PRODUCING THE WIRING BOARD

(75) Inventors: Hidetoshi Awata, Shimonoseki (JP); Yasuhiro Kiridoshi, Shimonoseki (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 322 days.

(21) Appl. No.: 11/235,138

(22) Filed: Sep. 27, 2005

(65) Prior Publication Data

US 2006/0065956 A1    Mar. 30, 2006

(30) Foreign Application Priority Data

Sep. 29, 2004  (JP)  ............... 2004-285500
Sep. 20, 2005  (JP)  ............... 2005-271789

(51) Int. Cl.
*H01L 23/58*  (2006.01)
*H01L 21/00*  (2006.01)
*H05K 1/00*  (2006.01)

(52) U.S. Cl. ............ 257/643; 257/668; 257/703; 257/E21.516; 257/E21.591; 361/750; 438/117

(58) Field of Classification Search ............ None
See application file for complete search history.

(56) References Cited

U.S. PATENT DOCUMENTS

| | | | |
|---|---|---|---|
| 6,280,851 B1 * | 8/2001 | Pasternack et al. | 428/447 |
| 6,458,234 B1 * | 10/2002 | Lake et al. | 156/230 |
| 6,572,780 B2 * | 6/2003 | McCormack et al. | 216/13 |
| 6,900,989 B2 * | 5/2005 | Sakata | 361/749 |
| 6,911,729 B1 * | 6/2005 | Chikawa | 257/724 |
| 7,173,322 B2 * | 2/2007 | Sakata et al. | 257/678 |
| 7,198,989 B2 * | 4/2007 | Sakata et al. | 438/117 |
| 7,225,919 B2 * | 6/2007 | Hamilton | 206/5.1 |

FOREIGN PATENT DOCUMENTS

| | | | |
|---|---|---|---|
| JP | 2000-334885 | | 12/2000 |
| JP | 2002-289651 | | 10/2002 |
| JP | 2004153194 A | * | 5/2004 |
| JP | 2004-207669 | | 7/2004 |
| JP | 2004-207670 | | 7/2004 |
| JP | 2004-207671 | | 7/2004 |

* cited by examiner

*Primary Examiner*—Alonzo Chambliss
(74) *Attorney, Agent, or Firm*—Sughrue Mion, PLLC

(57) ABSTRACT

The present invention provides a COF flexible printed wiring board whose insulating layer is not melt-adhered to a heating tool, and which exhibits no drop in bonding strength during panel bonding carried out after mounting of semiconductor chips, whereby reliability and productivity of a semiconductor chip mounting line is enhanced. The invention also provides a method of producing the COF flexible printed wiring board. The COF flexible printed wiring board including an insulating layer; a wiring pattern, on which a semiconductor chip is to be mounted, the pattern being formed of a conductor layer provided on at least one surface of the insulating layer; and a releasing layer, wherein the releasing layer is provided on the surface of the insulating layer opposite the semiconductor-chip-mounting surface, and is formed from a release agent containing a silicon-containing compound in such a thickness that Si intensity, as determined by means of a wavelength dispersive X-ray fluorescence analyzer, falls within a range of 0.15 to 2.5 kcps.

5 Claims, 5 Drawing Sheets

61

COF FLEXIBLE PRINTED WIRING BOARD AND METHOD OF PRODUCING THE WIRING BOARD

BACKGROUND OF THE INVENTION

1. Field of the Invention

The present invention relates to a COF flexible printed wiring board; e.g., a COF (chip-on-film) film carrier tape or a COF flexible printed circuit (FPC), for mounting electronic devices such as IC chips and LSI chips thereon. The invention also relates to a method of producing the COF flexible printed wiring board. The term "COF flexible printed wiring board" refers to a flexible printed wiring board having no device hole onto which electronic devices (chips) are to be mounted. The term "COF film carrier tape" refers to a film substrate assuming the form of tape having no device hole onto which electronic devices (chips) are to be mounted.

2. Description of the Related Art

Development of the electronics industry has been accompanied by sharp demand for printed-circuit boards for mounting electronic devices thereon, such as IC chips (Integrated Circuits) and LSI chips (Large-Scale Integrated circuits). Manufacturers have attempted to realize small-size, lightweight, and high-function electronic equipment, which has long been desired. To this end, manufactures have recently come to employ a film carrier tape, such as a TAB (tape automated bonding) tape, a T-BGA (ball grid array) tape, an ASIC tape, or an FPC (flexible printed circuit). Use of film carrier tapes for mounting electronic devices thereon has become of increasing importance, especially for manufacturers of personal computers, cellular phones, and other electronic equipment employing a liquid crystal display (LCD) that must have high resolution and flatness, as well as a narrow screen-frame area.

In addition, in order to attain higher-density mounting on a narrower space, mounting of IC chips directly on a flexible printed wiring board has been employed. Such a product is called COF (chip-on-film).

Since the flexible printed wiring board serving as a substrate of COFs does not have a device hole, a laminate film obtained by laminating in advance a conductor layer and an insulating layer is employed as the flexible printed wiring board. When IC chips are mounted on the wiring pattern, positioning is performed on the basis of marks such as an inner lead and a positioning mark which are visible from the insulating layer, followed by joining the IC chips and the wiring pattern; i.e., the inner lead, by means of a heating tool (see, for example, Japanese Patent Application Laid-Open (kokai) No. 2002-289651, FIGS. 4 to 6 and paragraphs [0004] and [0005]).

Such semiconductor chips are mounted while the insulating layer is in direct contact with a heating tool. Since the insulating layer is heated to a considerably high temperature by the heating tool during mounting, a portion of the insulating layer is caused to adhere to the heating tool by melting, thereby causing stoppage of a production apparatus. In addition, unfavorable deformation of the film carrier tape occurs. In the case where the insulating layer is melt-adhered to the heating tool, the heating tool is stained, thereby deteriorating reliability and productivity.

Such melt adhesion to the heating tool is critical when semiconductor chips are mounted on a COF film carrier tape or a COF FPC having no device hole.

In order to prevent melt adhesion to the heating tool, a COF film carrier tape having a releasing layer on the backside thereof has been developed (see, for example, Japanese Patent Application Laid-Open (kokai) No. 2004-207670, Claims).

However, such a COF film carrier tape also has a drawback. Specifically, when a COF film carrier tape provided with a releasing layer has been wound up without use of spacer tape, and the wound product has been stored for a long period of time before IC chip mounting, or when a film carrier tape has been cut to form a unit wiring pattern strip, and a plurality of such strips have been stacked for storing before IC chip mounting, a flexible substrate of such a film carrier tape exhibits poor bonding strength with respect to a panel during panel mounting (outer lead bonding) by the mediation of, for example, anisotropically conductive film (ACF).

SUMMARY OF THE INVENTION

In view of the foregoing, an object of the present invention is to provide a COF flexible printed wiring board whose insulating layer is not melt-adhered to a heating tool, and which exhibits no drop in bonding strength during panel bonding carried out after mounting of electronic parts such as semiconductor chips, thereby enhancing reliability and productivity of a semiconductor chip mounting line. Another object of the invention is to provide a method of producing the COF flexible printed wiring board.

Accordingly, in a first mode of the present invention, there is provided a COF flexible printed wiring board comprising an insulating layer; a wiring pattern, on which a semiconductor chip is to be mounted, the pattern being formed of a conductor layer provided on at least one surface of the insulating layer; and a releasing layer, wherein the releasing layer is provided on the surface of the insulating layer opposite the semiconductor-chip-mounting surface, is formed from a release agent containing a silicon-containing compound, and has such a thickness that intensity of fluorescence attributed to Si (hereinafter referred to as Si intensity), as determined by means of a wavelength dispersive X-ray fluorescence analyzer, falls within a range of 0.15 to 2.5 kcps.

Through employment of the COF flexible printed wiring board according to the first mode, the thickness of the releasing layer is controlled such that the Si intensity falls within a predetermined range. Thus, melt adhesion of the insulating layer on a heating tool and drop in bonding strength during panel mounting can be prevented.

In a second mode of the present invention, the releasing layer may be provided in such a thickness that Si intensity, as detected by means of a wavelength dispersive X-ray fluorescence analyzer, falls within a range of 0.3 to 1.0 kcps.

Since the thickness of the releasing layer is controlled such that Si intensity, as determined by means of a wavelength dispersive X-ray fluorescence analyzer, falls within a range of 0.3 to 1.0 kcps, melt-adhesion of the insulating layer to a heating tool and drop in bonding strength during panel bonding can be more reliably prevented.

In a third mode of the present invention, the releasing layer may be formed of a release agent containing at least one species selected from among a silane compound and silica sol.

Through employment of the releasing layer, melt-adhesion of the insulating layer to a heating tool can be more reliably prevented.

In a fourth mode of the present invention, there is provided a method of producing a COF flexible printed wiring board including an insulating layer, and a wiring pattern, on which a semiconductor chip is to be mounted, the pattern being formed of a conductor layer provided on at least one surface of the insulating layer, wherein the method comprises providing a releasing layer on the surface of the insulating layer opposite the semiconductor-chip-mounting surface, the releasing layer being formed from a release agent containing a silicon-containing compound, in such a thickness that Si intensity, as determined by means of a wavelength dispersive X-ray fluorescence analyzer, falls within a range of 0.15 to 2.5 kcps.

Through employment of the method according to the second aspect, the thickness of the releasing layer is controlled such that the Si intensity falls within a predetermined range. Thus, melt adhesion of the insulating layer on a heating tool and drop in bonding strength during panel mounting can be prevented.

In a fifth mode of the present invention, the releasing layer may be provided in such a thickness that Si intensity, as detected by means of a wavelength dispersive X-ray fluorescence analyzer, falls within a range of 0.3 to 1.0 kcps.

Since the thickness of the releasing layer is controlled such that Si intensity, as determined by means of a wavelength dispersive X-ray fluorescence analyzer, falls within a range of 0.3 to 1.0 kcps, melt-adhesion of the insulating layer to a heating tool and drop in bonding strength during panel bonding can be more reliably prevented.

In a sixth mode of the present invention, the releasing layer may be formed from a release agent containing at least one species selected from among a silane compound and silica sol.

Through employment of the method, a COF flexible printed wiring board which more reliably prevents melt-adhesion of the insulating layer to a heating tool can be produced.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1A:
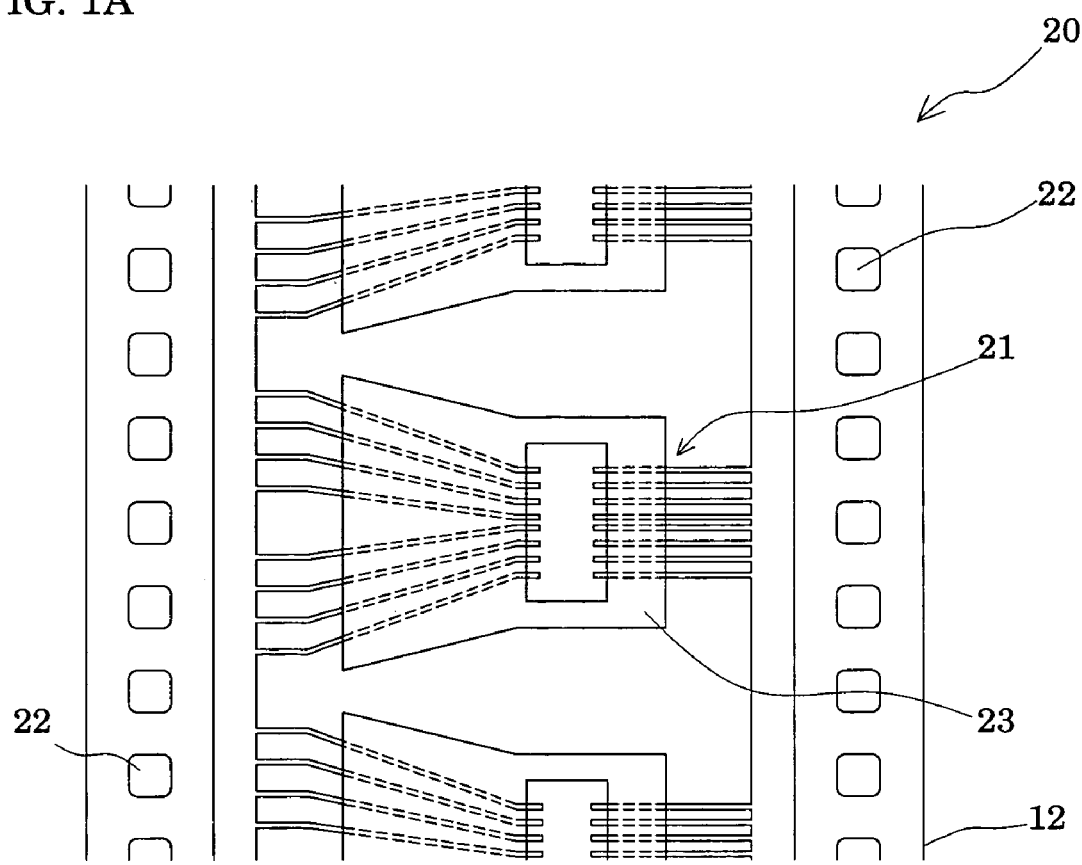
FIG. 1A is a schematic plan view of a COF film carrier tape according to one embodiment of the present invention.

The COF flexible printed wiring board (e.g., a COF film carrier tape or a COF FPC) of the present invention comprises a conductor layer and an insulating layer. No particular limitation is imposed on the laminate film comprising a conductor layer and an insulating layer and used in the COF flexible printed wiring board, and any type of conductor-insulator laminate film can be employed. Examples of such laminate film include a laminate film prepared by sputtering a bond-improving layer (e.g., Ni) on an insulating film (e.g., polyimide film) and plating copper on the bond-improving layer; a casting-type laminate film prepared by applying polyimide to copper foil; and a laminate film prepared through hot-press-adhesion of an insulating film onto copper foil by the mediation of a thermoplastic or thermosetting resin.

The COF flexible printed wiring board of the present invention or the COF flexible printed wiring board produced through the method of the present invention comprises the aforementioned laminate film and a releasing layer which is provided on the insulating layer of the laminate film opposing the conductor layer. In the production method of the present invention, no particular limitation is imposed on the silicon-containing compound for forming the releasing layer, so long as the compound has such releasability that adhesion of the laminate film to a heating tool during mounting of semiconductor chips is prevented and does not induce melt adhesion by heat. Both inorganic and organic materials are employable. Among them, a silicone compound; i.e., a silicon-containing compound which forms a compound having a siloxane bond (Si—O—Si) is preferred. A releasing layer comprising a silicone compound is preferred, since the layer can be formed in a relatively simple manner and does not tend to adversely affect adhesion of mold resin even when the releasing layer is transferred to a mount side of the produced printed circuit board.

The most essential feature of the present invention is that the releasing layer is provided in such a thickness that Si intensity, as determined by means of a wavelength dispersive X-ray fluorescence analyzer, falls within a range of 0.15 to 2.5 kcps, preferably 0.3 to 1.0 kcps. Notably, an energy dispersive X-ray fluorescence analyzer encounters difficulty in quantitatively determining the thickness of the releasing layer of the present invention having a thickness of some μm or less, since the energy dispersive X-ray fluorescence analyzer attains insufficient Si intensity.

When the Si intensity falls below the lower limit of the above range, transparency of the film is impaired. In other words, when the Si intensity falls within the above range, the surface of insulating layer is leveled through provision of the releasing layer, whereby transparency of the film is enhanced as compared with that of the film before provision of the releasing layer. When the Si intensity falls below the lower limit of the above range, transparency cannot be enhanced. In contrast, when the Si intensity exceeds the upper limit of the above range, the release agent forming the releasing layer tends to be transferred to an object being in contact with the releasing layer such as a wiring pattern, and bonding strength during ACF bonding or soldering is problematically reduced. Specifically, when a COF film carrier tape having a releasing layer exhibiting Si intensity in excess of the upper limit of the above range is wound up by the mediation of no spacer tape, the releasing layer tends to be readily transferred to the front surface of the tape. When film carrier tape strips are stacked, the releasing layer of each strip is readily transferred to the front surface of the strip. In the case where a releasing layer exhibiting Si intensity falling within the above range is provided, ACF bonding strength is determined to be 800 to 1,000 g/cm, at which peeling occurs due to a cohesive failure. In the case where a COF film carrier tape having a releasing layer exhibiting Si intensity exceeding the upper limit of the above range is directly wound up, followed by ACF bonding, ACF bonding strength is determined to be 300 to 500 g/cm, at which peeling occurs due to an interfacial failure.

Examples of the silicone compound serving as the release agent of the present invention; i.e., the release agent for forming a releasing layer composed of a siloxane-bond-containing compound, include silicone-based release agents. More specifically, such release agents contain at least one species selected from among siloxane compounds such as disiloxane and trisiloxane.

Preferably, the release agent comprises a compound which transforms into a silicone compound through application and reaction of the release agent. Examples of such compounds include silane compounds such as monosilane, disilane, and trisilane; and silica sol compounds.

Examples of more preferred release agents include release agents each containing an alkoxysilane compound, which is a type of silane compound, or a silazane compound such as hexamethyldisilazane or perhydropolysilazane, which belongs to silane compounds having an Si—NH—Si structure serving as a precursor for forming a siloxane bond. These release agents form a compound having a siloxane bond through application thereof or reaction with moisture or a similar substance contained in air after the application. However, unreacted Si—NH—Si may also be present in the release agents.

Particularly, a releasing layer composed of a silicone compound that is formed through application of a release agent and reaction thereof is preferred.

Although the above release agents generally contain an organic solvent, similar release agents of aqueous solution type or emulsion form may also be employed.

Specific examples of the release agents include silicone oil predominantly containing dimethylsiloxane; silicone resin SR 2411 (trade name: product of Dow Corning Toray Silicone Co., Ltd., containing methyltri(methyl ethyl ketoxime)silane, toluene, and ligroin); silicone resin SEPA-COAT (trade name: product of Shin-Etsu Chemical Co., Ltd., containing silazane, synthetic isoparaffin, and ethyl acetate); and COLCOAT SP-2014S (trade name: product of Colcoat Co., Ltd., containing a silane compound). Examples of release agents containing silica sol include COLCOAT P (trade names: products of Colcoat Co., Ltd.). Silica particles contained in silica sol have a particle size of, for example, 0.005 to 0.008 μm (50 to 80 Å).

Notably, provision of a releasing layer formed of a silicone-based release agent containing a silazane compound is particularly preferred, since the release agent has excellent releasability for preventing adhesion of the laminate film to a heating tool during mounting of semiconductor chips and does not induce melt adhesion by heat. Examples of such release agents containing a silazane compound include silicone resin SEPA-COAT (trade name: product of Shin-Etsu Chemical Co., Ltd., containing silazane, synthetic isoparaffin, and ethyl acetate).

No particular limitation is imposed on the method for forming such a releasing layer, and any-known method can be employed. For example, a release agent or a liquid thereof may be applied to a substrate through spraying, dipping, or roller-coating. Alternatively, a releasing layer provided on a film substrate may be transferred. In any case, bonding between the insulating layer and the releasing layer may be enhanced through, for example, heat treatment in order to prevent peeling of the releasing layer from the insulating layer. The releasing layer is not necessarily provided uniformly on the entire insulating layer, and may be provided in the form of discontinuous islands. For example, in the case where a releasing layer is transferred to a COF film carrier tape, the releasing layer may be provided in an area between the below-mentioned rows of sprocket holes or an area where semiconductor chips (IC chips) are mounted in a subsequent step, in the form of a continuous island or discontinuous islands.

No particular limitation is imposed on the timing of provision of the releasing layer, so long as the layer is provided prior to mounting of semiconductor elements. Specifically, the releasing layer may be provided after provision of the conductor layer; provided in advance on an insulating layer which has not been provided with a conductor layer; or provided simultaneously with provision of the conductor layer. Needless to say, the releasing layer is, not necessarily provided prior to patterning of the conductor layer, but may be provided after patterning of the conductor layer.

The transfer method is preferably employed in the cases in which, for example, the releasing layer is provided after provision of the conductor layer or in advance on an insulating layer which has not been provided with a conductor layer. When the releasing layer is provided after patterning of the conductor layer, the application method is preferably employed. Needless to say, the timing of formation of the releasing layer is not limited, and the layer may be provided at an initial stage before patterning of the conductor layer through application or may be provided after patterning of the conductor layer through transfer.

In one embodiment of the production method of the present invention, the releasing layer is provided after completion of photolithography and before mounting of semiconductor elements. The reason for choosing the above timing is that the releasing layer is possibly dissolved by a photoresist remover or a similar material. Therefore, the releasing layer is preferably provided after the processes of etching of the conductor layer and removal of a resist mask for forming a wiring pattern. Specifically, the releasing layer is preferably provided, for example, after the processes of removal of a resist mask and formation of a tin plating layer. Alternatively, the releasing layer is preferably provided after a series of processes of removal of the resist mask, provision of an insulating protective layer, and plating of a lead electrode. Such a releasing layer may be formed by applying a solution containing a release agent and bringing the applied solution to dryness. However, in order to enhance bonding strength between the insulating layer and the releasing layer, the applied solution is preferably heated. The conditions under which the heating is performed are, for example, at 50 to 200° C. for one minute to 120 minutes, preferably 100 to 200° C. for 30 minutes to 120 minutes.

According to another embodiment of the method of the present invention, a releasing layer provided on a film substrate may be transferred to the surface of the insulating layer opposite the conductor layer; i.e., the surface opposite the semiconductor-chip (IC) mounting side. Exemplary conditions under which the transfer is performed are, but are not limited to, a heating temperature of 15 to 200° C., a load for rolling or pressing of 5 to 50 kg/cm², and a treatment time of 0.1 seconds to two hours. After completion of transfer, bonding between the insulating layer and the releasing layer may be enhanced through, for example, heat treatment in order to prevent peeling of the releasing layer from the insulating layer. Exemplary conditions under which the heating is performed are, but are not limited to, at 50 to 200° C. for one minute to 120 minutes, preferably 100 to 200° C. for 30 minutes to 120 minutes.

According to the above transfer method, no particular limitation is imposed on the timing of provision of the releasing layer, so long as the layer is provided prior to mounting of semiconductor elements. Specifically, the releasing layer may be provided in advance on an insulating layer which has not been provided with a conductor layer; or provided simultaneously with provision of the conductor layer. Needless to say, the releasing layer is, not necessarily provided prior to patterning of the conductor layer, but may be provided after patterning of the conductor layer.

The transfer method is preferably employed in the cases in which, for example, the releasing layer is provided in advance on an insulating layer which has not been provided with a conductor layer. In the case in which the releasing layer is provided through the transfer method at an initial stage of production of the COF flexible printed wiring board, the following procedure may be employed. Specifically, the film substrate is not peeled from the releasing layer, so as to serve as a reinforcing film, and the film substrate is removed at a final production step.

In use of the COF flexible printed wiring board of the present invention, a semiconductor chip is mounted thereon. No particular limitation is imposed on the mounting method. For example, semiconductor chips are mounted by positioning and disposing the COF flexible printed wiring board on semiconductor chips which are placed on a chip stage, and pressing a heating tool against the COF flexible printed wiring board. In this case, since the wiring board has a releasing layer having such a thickness that Si intensity falls within the aforementioned specific range, the wiring board has transparency suitable for positioning, thereby facilitating positioning. During mounting, the heating tool is heated to at least 200° C., or in some cases, 350° C. or higher. However, since the COF flexible printed wiring board has a releasing layer formed on the insulating layer, melt adhesion between the heating tool and the insulating layer can be prevented. In addition, even when a film carrier tape provided with a releasing layer has been would up without use of spacer tape, or a film carrier tape has been cut to form strips, and such strips have been stacked for storing before IC chip mounting, transfer of the releasing layer to a wiring patter surface is can be prevented.

Hereafter, a COF film carrier tape, which is one embodiment of the COF flexible printed wiring board of the present invention, will be described. The following embodiments of the present invention will be described taking a COF film carrier tape as an example. However, needless to say, those with ordinary skill in the art would readily understand that COF FPCs can also be realized in an analogous manner.

Figure 1B:
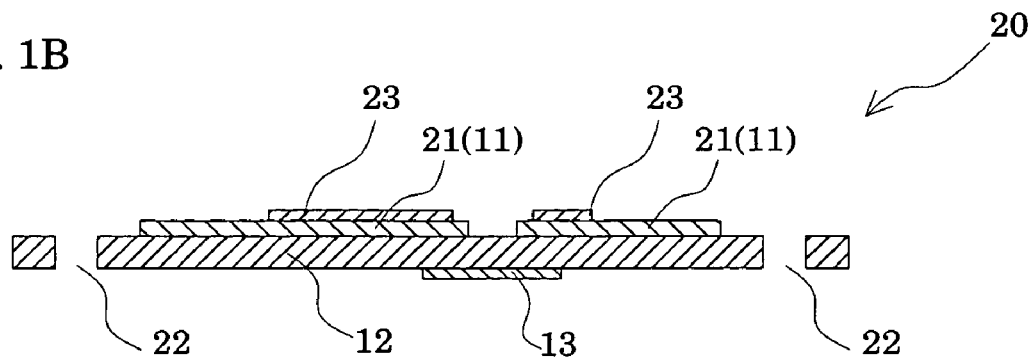
FIG. 1B is a schematic cross-sectional view of the COF film carrier tape according to the same embodiment of the present invention.

FIGS. 1A and 1B show a COF film carrier tape 20 according to one embodiment of the present invention.

As shown in FIGS. 1A and 1B, the COF film carrier tape 20 according to the present embodiment is produced from a laminate film for producing a COF, the laminate film comprising a conductor layer 11 (copper layer) and an insulating layer 12 (polyimide film). The COF film carrier tape 20 has wiring patterns 21 obtained by patterning the conductor layer 11, and a pair of transversely spaced rows of sprocket holes 22 provided along opposite longitudinal edges; this is, the two rows of sprocket holes 22 are disposed such that one row extends along each of the opposite longitudinal edges of the wiring pattern 21. The wiring patterns 21 are provided on a surface of the insulating layer 12 continuously in the longitudinal direction of the film carrier tape. Each wiring pattern 21 has, on a surface thereof, an insulating protective layer 23 which is formed by applying a solder resist coating solution through screen printing or attaching film thereto.

On the backside of the insulating layer 12 and at least in an area where bonding of an electrode (such as an IC chip) and an inner lead is performed, a releasing layer 13 is provided through application of a release agent or transfer of a transferable releasing layer. The releasing layer 13 may be provided on the entire backside of the insulating layer 12. The wiring patterns may be on provided both sides of the insulating layer 12 (such COF film carrier tape called "2-metal COF film carrier tape"). In this case, a releasing layer 13 is formed exclusively in an area where a heating tool is brought into contact with, through application of a release agent or transfer of a transferable releasing layer.

Although the conductor layer 11 can be formed from a metal other than copper; e.g., aluminum, gold, or silver, a copper layer is generally employed. No particular limitation is imposed on the type of copper layer, and any type of copper layers, such as a copper layer formed through vapor deposition or plating, electrodeposited copper foil, or rolled copper foil, can be used. Generally, the conductor layer 11 has a thickness of 1 to 70 μm, preferably 5 to 35 μm.

The insulating layer 12 may be formed from, other than polyimide, a polymeric material such as polyester, polyamide, polyether-sulfone, or liquid crystalline polymer. Of these, an aromatic polyimide (all repeating units being aromatic) prepared by polymerizing pyromellitic dianhydride and 4,4'-diaminodiphenyl ether (e.g., Kapton EN, product of Du Pont-Toray Co., Ltd.) and biphenyltetracarboxylic dianhydride-p-phenylenediamine (PPD) polymer (e.g., Upilex S, product of Ube Industries, Ltd.) are preferred. The thickness of the insulating layer 12 generally falls within a range of 12.5 to 125 μm, preferably 12.5 to 75 μm, more preferably 12.5 to 50 μm.

The laminate film for producing a COF is produced by, for example, applying to a conductor layer 11 (copper foil) a polyimide precursor resin composition containing a polyimide precursor and varnish, to thereby form a coating layer; removing the solvent by drying; winding the coating layer; and heating the wound coating layer in an oxygen-purged curing furnace for imidization, to thereby form the insulating layer 12. However, no particular limitation is imposed on the method for producing the laminate film.

A releasing layer 13 can be formed from a silicone-based release agent containing a silazane compound or a release agent containing silica sol. Preferably, the releasing layer 13 is formed by providing a release agent on the insulating layer 12 through, for example, the application method, followed by heating to thereby attain strong bonding between the releasing layer 13 and the insulating layer 12. The thickness of the releasing layer 13 is controlled such that Si intensity, as determined by means of a wavelength dispersive X-ray fluorescence analyzer, falls within a range of 0.15 to 2.5 kcps, preferably about 0.3 to 1.0 kcps, more preferably about 0.5±0.1 kcps.

On the above-described COF film carrier tape of the present invention, chips or electronic devices are mounted. For example, while the tape or substrate is conveyed, semiconductor chips are mounted on the tape, or electronic devices are mounted on a print substrate, to thereby yield COF products. Since the insulating layer 12 and the releasing layer 13 have an optical transmittance of 50% or higher, the image of the wiring patterns 21 (e.g., inner leads) can be recognized from the side of the releasing layer 13 by means of a CCD or a similar device. In addition, the bumps of semiconductor chips and the wiring patterns of printed circuit boards to be mounted can be recognized. Thus, precise positioning of the wiring patterns with respect to the insulating layer 12 can be performed through image processing, thereby mounting electronic devices at high precision.

The COF film carrier tape of the present invention is employed in, for example, a step of mounting electronic devices such as semiconductor chips and passive elements, while the tape is unwounded from a reel and conveyed. The releasing layer 13 is formed from a silicone-based release agent containing a silazane compound or a release agent containing silica sol also serving as antistatic agents. Whereby generation of static electricity during the mounting step can be prevented, so that electrostatic breakdown and similar failures of electronic devices can be prevented.

Next, one exemplary method of producing the aforementioned COF film carrier tape will be described with reference to FIGS. 2A to 2G.

Figure 2A:
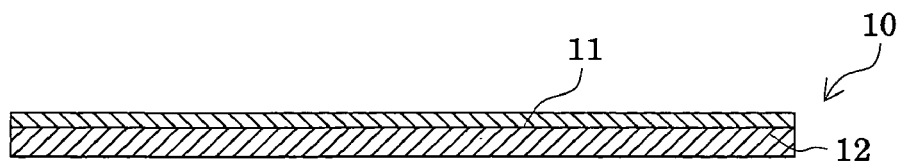
FIGS. 2A to 2G are cross-sectional views showing a method of producing a COF film carrier tape according to one embodiment of the present invention.
Figure 2B:
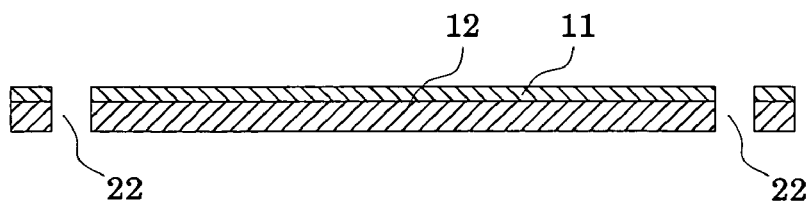
Figure 2C:
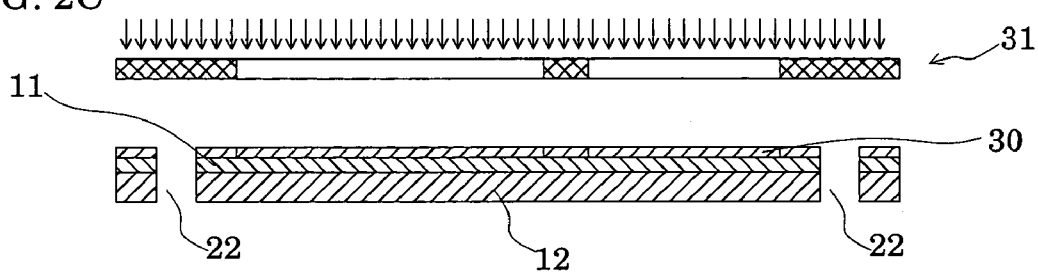
Figure 2D:
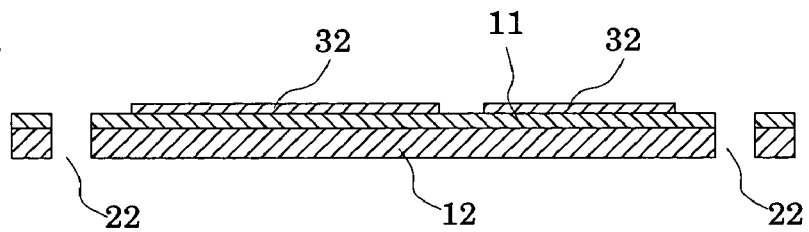
Figure 2E:
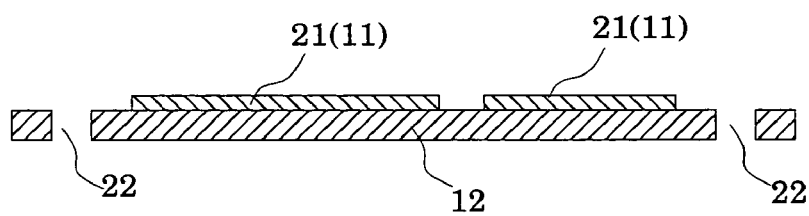

As shown in FIG. 2A, a laminate film 10 for producing a COF is provided. As shown in FIG. 2B, sprocket holes 22 are formed, by punching or a similar method, through a conductor layer 11 and an insulating layer 12. These sprocket holes 22 may be formed from the front side or the backside of the insulating layer 12. Then, as shown in FIG. 2C, a photoresist coating layer 30 is formed on a region of the conductor layer 11 for providing a wiring pattern 21, through a routine photolithographic method involving application of, for example, a negative type photoresist coating solution. Needless to say, a positive type photoresist may also be employed. After the insulating layer 12 is positioned by inserting positioning pins in the sprocket hole 22, the photoresist coating layer 30 is exposed via a photomask 31 and developed for patterning thereof, thereby forming a resist pattern 32 for providing a wiring pattern as shown in FIG. 2D. Subsequently, the conductor layer 11 is removed by dissolving with an etchant through the resist pattern 32 serving as a mask pattern, and the resist pattern 32 is removed by dissolving with an alkaline solution or a similar material, thereby forming a wiring pattern 21 as shown in FIG. 2E.

In addition to the wiring patterns 21, dummy wirings that are not connected with the wiring patterns 21 may be provided around the sprocket holes 22. The dummy wirings reinforce the insulating layer 12 and ensure smooth conveyance of the insulating layer 12 during production of the tape. The dummy wirings may be provided along each row of sprocket holes 22 continuously in the longitudinal direction of the insulating layer 12. Alternatively, the dummy wirings may be provided intermittently so as to surround each sprocket hole 22, whereby toughness of the film is enhanced to ensure conveyance thereof.

Figure 2F:
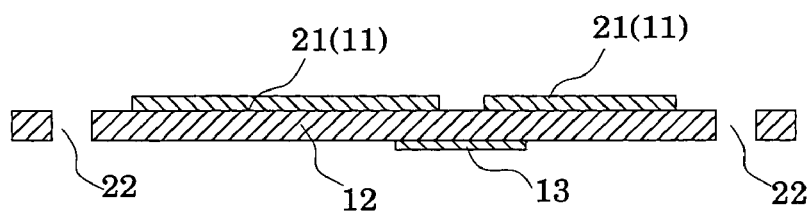
Figure 2G:
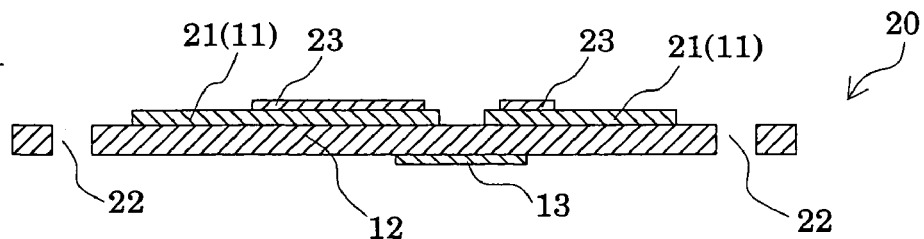

The entirety of the thus-formed wiring pattern 21 is plated (e.g., plated with tin) in accordance with needs. Subsequently, as shown in FIG. 2F, a releasing layer 13 is formed, through the application method, on the surface of the insulating layer 12 opposite the wiring pattern side and at least in an area where bonding of an electrode (such as an IC chip) and an inner lead is performed. Although the applied releasing layer 13 may be simply dried, heating of the layer is preferred, for enhancing a releasing effect; i.e., for preventing melt adhesion the insulating layer to a heating tool. Exemplary conditions under which the heating is performed are, but are not limited to, at 50 to 200° C. for one minute to 120 minutes, preferably 100 to 200° C. for 30 minutes to 120 minutes. The heating process may be performed simultaneously with curing solder resist. Subsequently, an insulating protective layer 23 is formed through, for example, screen printing, as shown in FIG. 2G. An outer lead and an inner lead, which are not covered with the insulating protective layer 23, are plated with a metal in accordance with needs. No particular limitation is imposed on the material of the metal plating layer, and tin plating, tin alloy plating, nickel plating, gold plating, gold alloy plating, or Pb-free solder plating such as Sn—Bi may appropriately be performed in accordance with the purpose of use.

In the embodiment described above, the releasing layer 13 is formed after removal of the resist pattern 32 with an alkali solution or a similar material and before provision of the insulating protective layer 23. Alternatively, the releasing layer 13 may be formed in the final production step after provision of the insulating protective resist layer 23. When the releasing layer 13 is formed through the latter method, exposure of the releasing layer 13 to an etchant, a photoresist remover, etc. is prevented, thereby attaining a high releasing effect. As described hereinabove, the term "final production step" refers to as a step immediately before the product inspection step.

As described above, the releasing layer 13 of the present invention is preferably formed after the photolithography step for forming wiring patterns 21 and before bonding with electronic parts such as semiconductor chips. The reason for the timing is that the releasing layer is possibly dissolved in a photoresist layer removal step. Therefore, the releasing layer 13 is preferably formed immediately after completion of the photolithography step or after plating, more preferably after formation of the insulating protective layer 23 or a similar step. Needless to say, the releasing layer 13 may also be formed before the photolithography step.

Figure 3A:
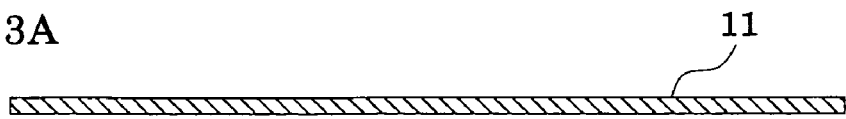
FIGS. 3A to 3E are cross-sectional views showing a method for producing a laminate film for a COF according to another embodiment of the present invention.
Figure 3B:
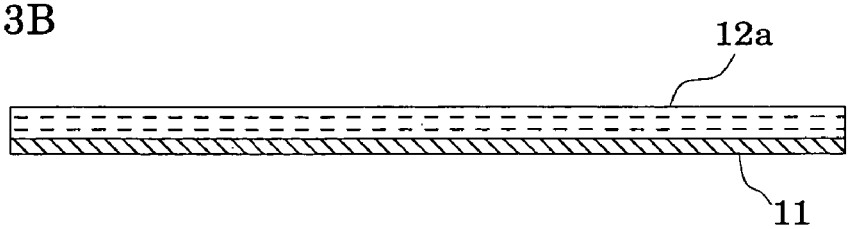
Figure 3C:
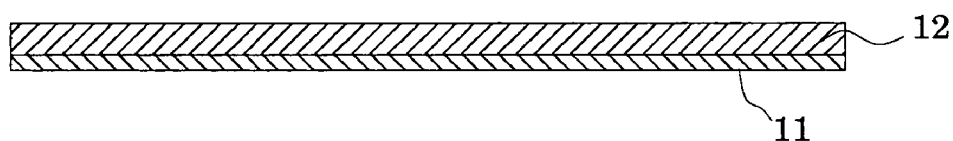
Figure 3D:
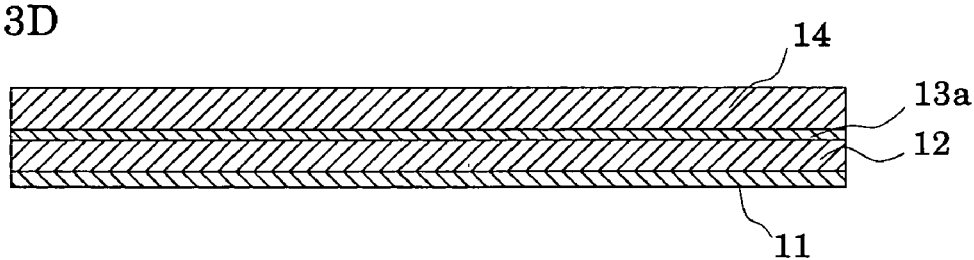
Figure 3E:
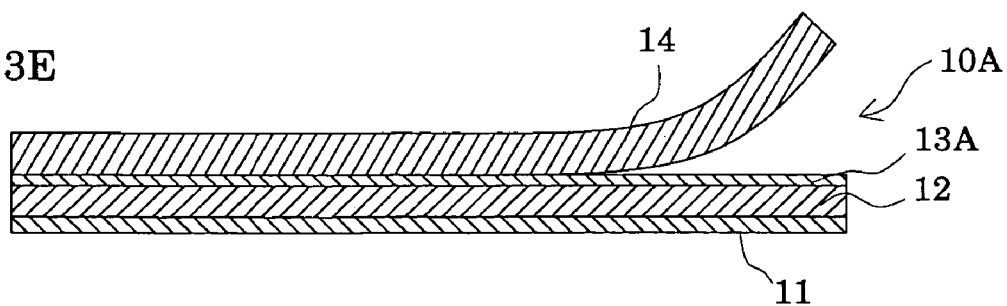

The releasing layer may be formed through the transfer method. Specifically, the aforementioned COF film carrier tape 20 may be produced from a laminate film 10A for producing a COF as shown in FIGS. 3A to 3E. The laminate film 10A shown in FIGS. 3A to 3E is produced by applying to a conductor layer 11 (copper foil, FIG. 3A) a polyimide precursor resin composition containing a polyimide precursor and varnish, to thereby form a coating layer 12a (FIG. 3B); removing the solvent by drying; winding the coating layer; and heating the wound coating layer in a curing furnace for imidization, to thereby form the insulating layer 12 (FIG. 3C). Subsequently, a releasing layer 13a formed on a transfer film 14 serving as a transfer substrate is brought into firm contact with the surface of the insulating layer 12 opposite to the side of the conductor layer 11 (FIG. 3D) and heated. Then, the transfer film 14 is peeled, thereby forming the laminate film 10A for producing a COF and having a releasing layer 13A (FIG. 3E). Exemplary conditions under which the transfer is performed are, but are not limited to, a heating temperature of 15 to 200° C., a load for rolling or pressing of 5 to 50 kg/cm², and a treatment time of 0.1 seconds to two hours. Exemplary conditions under which the heating is performed are, but are not limited to, at 50 to 200° C. for one minute to 120 minutes, preferably 100 to 200° C. for 30 minutes to 120 minutes. Needless to say, formation of the releasing layer 13A through transfer may be performed after the photolithography step or a similar step. Examples of the material of the transfer film 14 include PET (polyethylene terephthalate), PI (polyimide), and liquid crystal polymers. The thickness of such transfer film 14 is, for example, 15 to 100 μm, preferably 20 to 75 μm.

Figure 4:
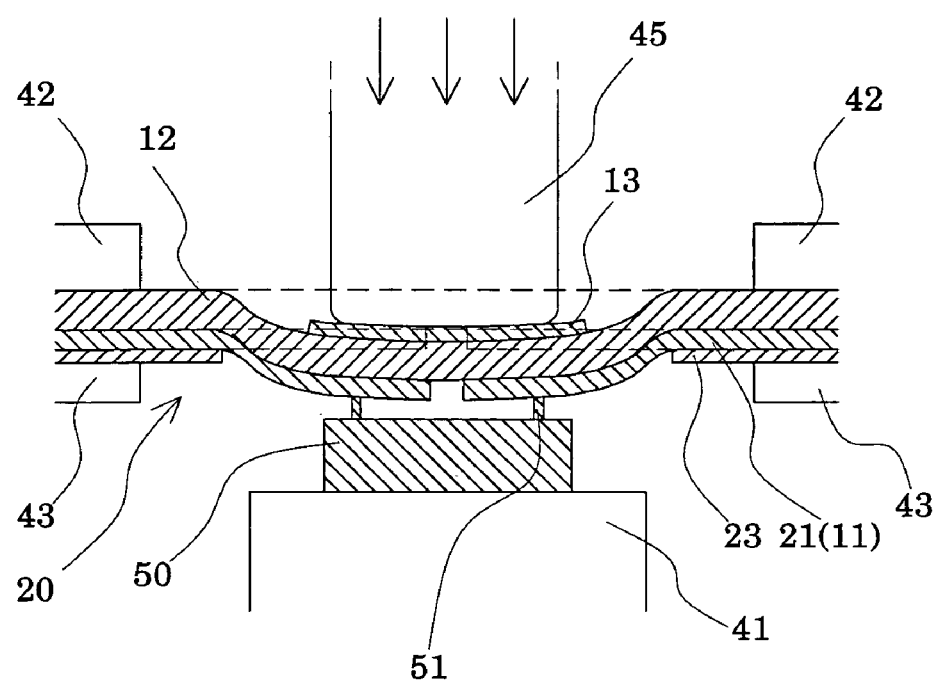
FIG. 4 is a cross-sectional view showing a method of producing a semiconductor device according to one embodiment of the present invention.

As shown in FIG. 4, the semiconductor device of the present invention is produced by mounting a semiconductor chip 50 on a COF film carrier tape 20 produced in the above-described manner. Specifically, the COF film carrier tape 20 is conveyed and then positioned at a predetermined position, while the semiconductor chip 50 is placed on a chip stage 41. Subsequently, the COF film carrier tape 20 is fixed by means of upper clamps 42 and lower clamps 43, with each upper clamp 42 descending while a corresponding lower clamp 43 ascending. A heating tool 45 is pressed against the thus-fixed COF film carrier tape 20 so as to heat the tape, and further descends, thereby pressing an inner lead of the COF film carrier tape 20 against a bump 51 of the semiconductor chip 50. Pressing is performed for a predetermined period of time, thereby bonding the inner lead and the semiconductor chip 50. After completion of bonding, the bonded chip is sealed with resin, to thereby produce a semiconductor device.

Depending on time and pressure of pressing or other conditions, the temperature of the heating tool 45 is controlled to 200° C. or higher, preferably 350° C. or higher. According to the present invention, even when the heating tool 45 is heated to such high temperature, melt adhesion between the COF film carrier tape 20 and the heating tool 45 is prevented by virtue of a releasing layer 13 provided on a surface of the film carrier tape 20 to be brought into contact with the heating tool 45. Therefore, according to the present invention, bonding can be performed at sufficiently high temperature, thereby ensuring high bonding strength. In other words, since heating temperature can be elevated for attaining a predetermined level of bonding strength, the time required for press bonding can be shortened, which is advantageous.

The aforementioned embodiments have been described taking as an example a film carrier tape 20 for mounting electronic parts, the carrier tape having a single row of carrier patterns including wiring patterns 21 and sprocket holes 22. However, the present invention is not limited to these embodiments, and a film carrier tape for mounting electronic parts which film has a plurality of rows of carrier patterns also falls within the scope of the invention.

The above embodiments of the invention are directed to a film carrier tape for mounting electronic parts which film serves as a COF film carrier tape. However, other films carrier tape for mounting electronic parts; e.g., TAB, CSP, BGA, μ-BGA, FC, and QFP also fall within the scope of the present invention, and no particular limitation is imposed on the structure and other factors of the film carrier tapes.

The flexible printed wiring board of the present invention may be subjected to inner lead bonding as well as outer lead bonding by use of such as solder.

EXAMPLES

Example 1

Figure 5:
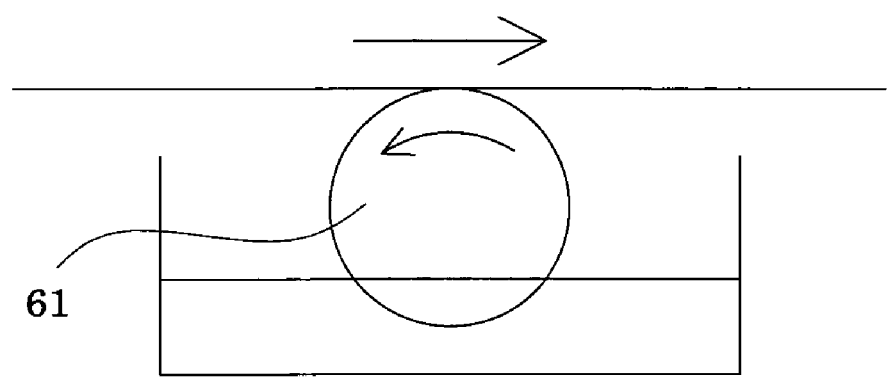
FIG. 5 is a sketch showing a method of forming a releasing layer according to one embodiment of the present invention.

An Ni—Cr alloy was sputtered on a commercial polyimide base film (Kapton EN, product of Du Pont-Toray Co., Ltd.), to thereby form a seed layer, and a copper layer was formed on the seed layer through plating, to thereby form a double-layer tape. Through etching the copper layer, a wiring pattern 21 was formed. As shown in FIG. 5, COL-COAT P (trade name: product of Colcoat Co., Ltd., silica sol-containing) serving as a release agent was applied, by use of a roller coater 61, to the surface of the film carrier tape opposite the surface on which semiconductor chips were mounted, while the film carrier tape was conveyed at 1 m/min. The releasing layer was provided on the backside of the film carrier tape except for the longitudinal edge portions where sprocket holes were provided. After drying, a solder resist was applied to the tape, and the releasing layer and the insulating protective layer were heated simultaneously, to thereby form a film carrier tape final product. The thus-formed releasing layer was found be a uniform film, exhibiting Si intensity, as determined by means of a wavelength dispersive X-ray fluorescence analyzer, of 0.5±0.1 kcps. The temperature at which adhesion of the film carrier tape to a heating tool occurred was determined to be 390° C.

Example 2

The procedure of Example 1 was repeated, except that the pressure applied to the film abutting the coater 61 was modified, to thereby form a releasing layer. The releasing layer exhibited Si intensity, as determined by means of a wavelength dispersive X-ray fluorescence analyzer, of 0.3±0.1 kcps. The temperature at which adhesion of the film carrier tape to a heating tool occurred was determined to be 360° C.

Example 3

The procedure of Example 1 was repeated, except that the pressure applied to the film abutting the coater 61 was modified, to thereby form a releasing layer. The releasing layer exhibited Si intensity, as determined by means of a wavelength dispersive X-ray fluorescence analyzer, of 2.3±0.1 kcps. The temperature at which adhesion of the film carrier tape to a heating tool occurred was determined to be 490° C.

Comparative Example 1

The procedure of Example 1 was repeated, except that the pressure applied to the film abutting the coater 61 was modified, to thereby form a releasing layer. The releasing layer exhibited Si intensity, as determined by means of a wavelength dispersive X-ray fluorescence analyzer, of 0.05±0.05 kcps. The temperature at which adhesion of the film carrier tape to a heating tool occurred was determined to be 320° C.

Comparative Example 2

The procedure of Example 1 was repeated, except that the pressure applied to the film abutting the coater 61 was modified, to thereby form a releasing layer. The releasing layer exhibited Si intensity, as determined by means of a wavelength dispersive X-ray fluorescence analyzer, of 2.7±0.1 kcps. The temperature at which adhesion of the film carrier tape to a heating tool occurred was determined to be 500° C.

Test Example 1

Optical transmittance of the film of Example 1 and that of Comparative Example 1 were determined at 600 nm to be 69% and 65%, respectively. A blank film which had no releasing layer and from which Cu was removed through etching exhibited an optical transmittance of 65%.

The results indicate that the film of Example 1 exhibiting an Si intensity falling within a scope of the present invention exhibits an improved optical transmittance as compared with that of the blank film, and that the film of Comparative Example 1 exhibiting an Si intensity lower than the lower limit of the range exhibits an optical transmittance equivalent to that of the blank film.

Test Example 2

On each of the films of Examples 1 to 3 and Comparative Example 2, IC chips were mounted. Each film was directly wound up without use of spacer tape, and the wound film was stored for seven days. After storage, the film was drawn and cut, and a cut film piece was subjected to panel mounting. Bonding strength of ACF to the film was determined through the following procedure.

First, an epoxy ACF (width: 10 mm) was temporarily bonded onto a glass substrate through pressing at 80° C. Subsequently, the ACF was stacked on an outer lead (output side) area of the film carrier tape where no electronic parts such as IC chips were mounted. The stacked films were pressed at 180° C. and 0.3 MPa for 10 seconds. The thus-obtained test sample was set in a tensile test machine, and a tensile strength required for peeling one end of the film carrier tape was determined as the bonding strength. The results are shown in Table 1.

TABLE 1

|  | ACF bonding strength (kg/cm) |
|---|---|
| Example 1 | 950 |
| Example 2 | 970 |
| Example 3 | 810 |
| Comp. Ex. 2 | 380 |

As is clear from Table 1, the film carrier tapes of Examples 1 to 3 exhibit an ACF bonding strength of 800 to 1,000 kg/cm, at which peeling occurs due to a cohesive failure. The film carrier tape of Comparative Example 2 having a releasing layer exhibiting Si intensity exceeding the upper limit of the range of the present invention exhibits an ACF bonding strength as low as 380 kg/cm, and peeling occurred due to an interfacial failure.

What is claimed is:

1. A COF flexible printed wiring board comprising an insulating layer;
a wiring pattern, on which a semiconductor chip is to be mounted, the pattern being formed of a conductor layer provided on at least one surface of the insulating layer; and
a releasing layer, wherein the releasing layer is provided on the surface of the insulating layer opposite the semiconductor-chip-mounting surface, is formed from a release agent containing a silicon-containing compound, and has such a thickness that Si intensity, as determined by means of a wavelength dispersive X-ray fluorescence analyzer, falls within a range of 0.15 to 2.5 kcps.

2. A COF flexible printed wiring board according to claim 1, wherein the releasing layer is provided in such a thickness that Si intensity, as detected by means of a wavelength dispersive X-ray fluorescence analyzer, falls within a range of 0.3 to 1.0 kcps.

3. A COF flexible printed wiring board according to claim 1, wherein the releasing layer is formed of a release agent containing at least one species selected from among a silane compound and silica sol.

4. A method of producing a COF flexible printed wiring board including an insulating layer, and a wiring pattern, on which a semiconductor chip is to be mounted, the pattern being formed of a conductor layer provided on at least one surface of the insulating layer, wherein the method comprises providing a releasing layer on the surface of the insulating layer opposite the semiconductor-chip-mounting surface, the releasing layer being formed from a release agent containing a silicon-containing compound, in such a thickness that Si intensity, as determined by means of a wavelength dispersive X-ray fluorescence analyzer, falls within a range of 0.15 to 2.5 kcps.

5. A method of producing a COF flexible printed wiring board according to claim 4, wherein the releasing layer is formed from a release agent containing at least one species selected from among a silane compound and silica sol.

* * * * *